United States Patent
Reinberg et al.

(10) Patent No.: US 7,453,082 B2
(45) Date of Patent: Nov. 18, 2008

(54) SMALL ELECTRODE FOR A CHALCOGENIDE SWITCHING DEVICE AND METHOD FOR FABRICATING SAME

(75) Inventors: Alan R. Reinberg, Boise, ID (US); Russell C. Zahorik, deceased, late of Boise ID (US); by Renee Zahorik, legal representative, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/494,052

(22) Filed: Jul. 27, 2006

(65) Prior Publication Data

US 2006/0261380 A1  Nov. 23, 2006

Related U.S. Application Data (60) Continuation of application No. 10/872,765, filed on Jun. 21, 2004, now Pat. No. 7,102,151, which is a continuation of application No. 09/740,256, filed on Dec. 19, 2000, now Pat. No. 6,777,705, which is a continuation of application No. 09/344,604, filed on Jun. 25, 1999, now Pat. No. 6,189,582, which is a division of application No. 08/854,220, filed on May 9, 1997, now Pat. No. 5,952,671.

(51) Int. Cl.
*H01J 47/00* (2006.01)

(52) U.S. Cl. ............. 257/3; 257/4; 257/5; 257/E45.002

(58) Field of Classification Search .............. 257/2–5, 257/E45.002
See application file for complete search history.

(56) References Cited

U.S. PATENT DOCUMENTS

| | | | |
|---|---|---|---|
| 3,423,646 A | 1/1969 | Cubert et al. |
| 3,602,635 A | 8/1971 | Raomankiw |
| 3,796,926 A | 3/1974 | Cole et al. |
| 3,877,049 A | 4/1975 | Buckley |
| 3,886,577 A | 5/1975 | Buckley |

(Continued)

FOREIGN PATENT DOCUMENTS

EP  0 117 045  8/1984

(Continued)

OTHER PUBLICATIONS

Kim and Kim, "Effects of High-Current Pulses on Polycrystalline Silicon Diode with n-type Region Heavily Doped with Both Boron and Phosphorus," *J. Appl. Phys.*, 53(7):5359-5360, Jul. 1982.

(Continued)

*Primary Examiner*—Thien F Tran
(74) *Attorney, Agent, or Firm*—Fletcher Yoder (57) ABSTRACT

A memory cell and a method of fabricating the memory cell having a small active area are provided. By forming a spacer in a window that is sized at the photolithographic limit, in one embodiment, a pore may be formed in dielectric layer which is smaller than the photolithographic limit. Electrode material is deposited into the pore, and a layer of structure changing material, such as chalcogenide, is deposited onto the lower electrode, thus creating a memory element having an extremely small and reproducible active area.

19 Claims, 5 Drawing Sheets

U.S. PATENT DOCUMENTS

| | | | |
|---|---|---|---|
| 4,099,260 A | 7/1978 | Lynes et al. | |
| 4,115,872 A | 9/1978 | Bluhm | |
| 4,174,521 A | 11/1979 | Neale | |
| 4,194,283 A | 3/1980 | Hoffmann | |
| 4,203,123 A | 5/1980 | Shanks | |
| 4,227,297 A | 10/1980 | Angerstein | |
| 4,272,562 A | 6/1981 | Wood | |
| 4,433,342 A | 2/1984 | Patel et al. | |
| 4,458,260 A | 7/1984 | McIntyre et al. | |
| 4,499,557 A | 2/1985 | Holmberg et al. | |
| 4,502,208 A | 3/1985 | McPherson | |
| 4,502,914 A | 3/1985 | Trumpp et al. | |
| 4,569,698 A | 2/1986 | Feist | |
| 4,616,404 A | 10/1986 | Wang et al. | |
| 4,630,355 A | 12/1986 | Johnson | |
| 4,642,140 A | 2/1987 | Noufi et al. | |
| 4,666,252 A | 5/1987 | Yaniv et al. | |
| 4,677,742 A | 7/1987 | Johnson | |
| 4,757,359 A | 7/1988 | Chiao et al. | |
| 4,795,657 A | 1/1989 | Formigoni et al. | |
| 4,804,490 A | 2/1989 | Pryor et al. | |
| 4,809,044 A | 2/1989 | Pryor et al. | |
| 4,823,181 A | 4/1989 | Mohsen et al. | |
| 4,876,220 A | 10/1989 | Mohsen et al. | |
| 4,876,668 A | 10/1989 | Thakoor et al. | |
| 4,881,114 A | 11/1989 | Mohsen et al. | |
| 4,892,840 A | 1/1990 | Esquivel et al. | |
| 5,144,404 A | 9/1992 | Iranmanesh et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,293,335 A | 3/1994 | Pernisz et al. | |
| 5,296,716 A | 3/1994 | Ovshinsky et al. | |
| 5,335,219 A | 8/1994 | Ovshinsky et al. | |
| 5,341,328 A | 8/1994 | Ovshinsky et al. | |
| 5,359,205 A | 10/1994 | Ovshinsky | |
| 5,363,329 A | 11/1994 | Troyan | |
| 5,414,271 A | 5/1995 | Ovshinsky et al. | |
| 5,429,988 A | 7/1995 | Huang et al. | |
| 5,510,629 A | 4/1996 | Karpovich et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,569,932 A | 10/1996 | Shor et al. | |
| 5,578,185 A | 11/1996 | Bergeron et al. | |
| 5,687,112 A | 11/1997 | Ovshinsky | |
| 5,714,768 A | 2/1998 | Ovshinsky et al. | |
| 5,714,795 A | 2/1998 | Ohmi et al. | |
| 5,751,012 A | 5/1998 | Wolstenholme et al. | |
| 5,789,277 A | 8/1998 | Zahorik et al. | |
| 5,789,758 A | 8/1998 | Reinberg | |
| 5,812,441 A | 9/1998 | Manning | |
| 5,814,527 A | 9/1998 | Wolstenholme et al. | |
| 5,831,276 A | 11/1998 | Gonzalez et al. | |
| 5,841,150 A | 11/1998 | Gonzalez et al. | |
| 6,111,264 A | 8/2000 | Wolstenholme et al. | |

FOREIGN PATENT DOCUMENTS

| | | |
|---|---|---|
| GB | 1 319 388 | 6/1973 |
| JP | 60109266 | 6/1985 |

OTHER PUBLICATIONS

Neale and Aseltine, "The Application of Amorphous Materials to Computer Memories," *IEEE Transactions on Election Devices*, 20(2):195-205, Feb. 1973.

Pein and Plummer, "Performance of the 3-D Sidewall Flash EPROM Cell," *International Electron Devices Meeting,*, 11-14, Dec. 1993.

Post and Ashburn, "Investigation of Boron Diffusion in Polysilicon and its Application to the Design of p-n-p Polysilicon Emitter Bipolar Transistors with Shallow Emitter Junctions," *IEEE Transactions on Electron Devices*, 38(11):2442-2451, Nov. 1991.

Post et al., "Polysilicon Emitters for Bipolar Transistors: A Review and Re-Evaluation of Theory and Experiment," *IEEE Transactions on Electron Devices*, 39(7):1717-1731, Jul. 1992.

Post and Ashburn, "The Use of an Interface Anneal to Control the Base Current and Emitter Resistance of p-n-p Polysilicon Emitter Bipolar Transistors," *IEEE Electron Device Letters*, 13(8):408-410, Aug. 1992.

Rose et al., "Amorphous Silicon Analogue Memory Devices," *J. Non-Crystalline Solids*, 115:168-170, 1989.

Schaber et al., "Laser Annealing Study of the Grain Size Effect in Polycrystalline Silicon Schottky Diodes," *J. Appl. Phys.*, 53(12):8827-8834, Dec. 1982.

Yamamoto et al., "The I-V Characteristics of Polycrystalline Silicon Diodes and the Energy Distribution of Traps in Grain Boundaries," *Electronics and Communications in Japan*, Part 2, 75(7):51-58, 1992.

Yeh et al., "Investigation of Thermal Coefficient for Polycrystalline Silicon Thermal Sensor Diode," *Jpn. J. Appl. Phys.*, 31(Part 1, No. 2A):151-155, Feb. 1992.

Oakley et al., "Pillars—The Way to Two Micron Pitch Multilevel Metallisation," *IEEE*, 23-29, 1984.

Prince, "Semiconductor Memories," A Handbook of Design, Manufacture, and Application, $2^{nd}$ Ed., Wiley, pp. 118-123, Jul. 1996.

SMALL ELECTRODE FOR A CHALCOGENIDE SWITCHING DEVICE AND METHOD FOR FABRICATING SAME

CROSS REFERENCE TO RELATED APPLICATIONS

This application is a continuation of U.S. patent application Ser. No. 10/872,765, filed on Jun. 21, 2004 now U.S. Pat. No. 7,102,151, which is a continuation of U.S. patent application Ser. No. 09/740,256, filed Dec. 19, 2000 now U.S. Pat. No. 6,777,705, which is a continuation of U.S. patent application Ser. No. 09/344,604, filed Jun. 25, 1999 now U.S. Pat. No. 6,189,582, which is a divisional of U.S. patent application Ser. No. 08/854,220, filed May 9,1997 now U.S. Pat. No. 5,952,671.

BACKGROUND OF THE INVENTION

1. Field of the Invention

The present invention relates generally to semiconductor fabrication techniques and, more particularly, to a method for fabricating small electrodes for use with a chalcogenide switching device, such as, for example, a chalcogenide memory cell.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs). While non-volatile memories that permit limited reprogramming exist, such as electrically erasable and programmable "ROMs," all true random access memories, i.e., those memories capable of $10^{14}$ programming cycles or more, are volatile memories. Although one time programmable read only memories and moderately reprogrammable memories serve many useful applications, a true nonvolatile random access memory (NVRAM) would be needed to surpass volatile memories in usefulness.

Efforts have been underway to create a commercially viable memory device, which is both random access and nonvolatile, using structure changing memory elements, as opposed to charge storage memory elements used in most commercial memory devices. The use of electrically writable and erasable phase change materials, i.e., materials which can be electrically switched between generally amorphous and generally crystalline states or between different resistive states while in crystalline form, in memory applications is known in the art and is disclosed, for example, in U.S. Pat. No. 5,296,716 to Ovshinsky et al., the disclosure of which is incorporated herein by reference. The Ovshinsky patent is believed to indicate the general state of the art and to contain a discussion of the general theory of operation of chalcogenide materials, which are a particular type of structure changing material.

As disclosed in the Ovshinsky patent, such phase change materials can be electrically switched between a first structural state, in which the material is generally amorphous, and a second structural state, in which the material has a generally crystalline local order. The material may also be electrically switched between different detectable states of local order across the entire spectrum between the completely amorphous and the completely crystalline states. In other words, the switching of such materials is not required to take place in a binary fashion between completely amorphous and completely crystalline states. Rather, the material can be switched in incremental steps reflecting changes of local order to provide a "gray scale" represented by a multiplicity of conditions of local order spanning the spectrum from the completely amorphous state to the completely crystalline state.

These memory elements are monolithic, homogeneous, and formed of chalcogenide material typically selected from the group of Te, Se, Sb, Ni, and Ge. This chalcogenide material exhibits different electrical characteristics depending upon its state. For instance, in its amorphous state the material exhibits a higher resistivity than it does in its crystalline state. Such chalcogenide materials can be switched between numerous electrically detectable conditions of varying resistivity in nanosecond time periods with the input of picojoules of energy. The resulting memory element is truly non-volatile. It will maintain the integrity of the information stored by the memory cell without the need for periodic refresh signals, and the data integrity of the information stored by these memory cells is not lost when power is removed from the device. The memory material is also directly overwritable so that the memory cells need not be erased, i.e., set to a specified starting point, in order to change information stored within the memory cells. Finally, the large dynamic range offered by the memory material theoretically provides for the gray scale storage of multiple bits of binary information in a single cell by mimicking the binary encoded information in analog form and, thereby, storing multiple bits of binary encoded information as a single resistance value in a single cell.

The operation of chalcogenide memory cells requires that a region of the chalcogenide memory material, called the "active region," be subjected to a current pulse to change the crystalline state of the chalcogenide material within the active region. Typically, a current density of between about $10^5$ and $10^7$ amperes/cm$^2$ is needed. To obtain this current density in a commercially viable device having at least 64 million memory cells, for instance, the active region of each memory cell must be made as small as possible to minimize the total current drawn by the memory device. Currently, chalcogenide memory cells are fabricated by first creating a diode in a semiconductor substrate. A lower electrode is created over the diode, and a layer of dielectric material is deposited onto the lower electrode. A small opening is created in the dielectric layer. A second dielectric layer, typically of silicon nitride, is then deposited onto the dielectric layer and into the opening. The second dielectric layer is typically about 40 Angstroms thick. The chalcogenide material is then deposited over the second dielectric material and into the opening. An upper electrode material is then deposited over the chalcogenide material.

A conductive path is then provided from the chalcogenide material to the lower electrode material by forming a pore in the second dielectric layer by a process known as "popping." Popping involves passing an initial high current pulse through the structure to cause the second dielectric layer to breakdown. This dielectric breakdown produces a conductive path through the memory cell. Unfortunately, electrically popping the thin silicon nitride layer is not desirable for a high density memory product due to the high current and the large amount of testing time required. Furthermore, this technique may produce memory cells with differing operational characteristics, because the amount of dielectric breakdown may vary from cell to cell.

The active regions of the chalcogenide memory material within the pores of the dielectric material created by the popping technique are believed to change crystalline structure in response to applied voltage pulses of a wide range of magnitudes and pulse durations. These changes in crystalline structure alter the bulk resistance of the chalcogenide active region. Factors such as pore dimensions (e.g., diameter, thickness, and volume), chalcogenide composition, signal pulse duration, and signal pulse waveform shape may affect the magnitude of the dynamic range of resistances, the absolute endpoint resistances of the dynamic range, and the voltages required to set the memory cells at these resistances. For example, relatively thick chalcogenide films, e.g., about 4000 Angstroms, result in higher programming voltage requirements, e.g., about 15-25 volts, while relatively thin chalcogenide layers, e.g., about 500 Angstroms, result in lower programming voltage requirements, e.g., about 1-7 volts. Thus, to reduce the required programming voltage, it has been suggested that the cross-sectional area of the pore should be reduced to reduce the size of the chalcogenide element.

The energy input required to adjust the crystalline state of the chalcogenide active region of the memory cell is directly proportional to the minimum lateral dimension of the pore. In other words, programming energy decreases as the pore size decreases. Conventional chalcogenide memory cell fabrication techniques provide a minimum lateral pore dimension, e.g., the diameter or width of the pore, that is limited by the photolithographic size limit. This results in pore sizes having minimum lateral dimensions down to approximately 1 micron.

The present invention is directed to overcoming, or at least reducing the affects of, one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a memory cell. The memory cell includes an access device that is formed on a semiconductor substrate. A layer of dielectric material is disposed on the access device. The layer of dielectric material has a pore therein. The pore is smaller than the photolithographic limit. A first layer of conductive material is disposed within the pore to form a first electrode. A layer of structure changing material is disposed on the first electrode. A second layer of conductive material is disposed on the layer of structure changing material to form a second electrode.

In accordance with another aspect of the present invention, there is provided a memory array. The memory array includes a plurality of memory cells. Each memory cell includes an access device that is formed on a semiconductor substrate. A layer of dielectric material is disposed on the access device. The layer of dielectric material has a pore therein. The pore is smaller than the photolithographic limit. A first layer of conductive material is disposed within the pore to form a first electrode. A layer of structure changing material is disposed on the first electrode. A second layer of conductive material is disposed on the layer of structure changing material to form a second electrode. The memory array also includes a grid that is coupled to the plurality of memory cells. The grid is formed by a first plurality of conductive lines that generally extend in a first direction and a second plurality of conductive lines that generally extend in a second direction.

In accordance with still another aspect of the present invention, there is provided a method of fabricating a memory cell. The method includes the steps: (a) forming an access device on a semiconductor substrate; (b) depositing a layer of dielectric material on the access device; (c) forming a pore in the layer of dielectric material, where the pore is smaller than the photolithographic limit; (d) depositing a first layer of conductive material within the pore to form a first electrode; (e) depositing a layer of structure changing material on the first electrode; and (f) depositing a second layer of conductive material on the layer of structure changing material to form a second electrode.

In accordance with yet another aspect of the present invention, there is provided a method of fabricating a memory array. The method includes the steps of (a) forming an access device on a semiconductor substrate; (b) forming a first plurality of conductive lines, where each of the first plurality of conductive lines is coupled to respective access devices; (c) depositing a layer of dielectric material on the access device; (d) forming a pore in the layer of dielectric material, where the pore is smaller than the photolithographic limit; (e) depositing a first layer of conductive material within the pore to form a first electrode; (f) depositing a layer of structure changing material on the first electrode; (g) depositing a second layer of conductive material on the layer of structure changing material to form a second electrode; and (h) forming a second plurality of conductive lines, where each of the second plurality of conductive lines is coupled to respective second electrodes.

In accordance with a further aspect of the present invention, there is provided a method of fabricating an array of pores. The method includes the steps of (a) forming a mask over a layer of dielectric material, where the mask has a plurality of windows therein exposing portions of the layer of dielectric material, and where the windows are sized at the photolithographic limit; (b) forming a spacer within each of the windows, where each spacer covers a peripheral portion of the respective exposed portion of the layer of dielectric material to create a second window that exposes a portion of the layer of dielectric material smaller than the photolithographic limit; and (c) removing the exposed portions of the layer of dielectric material created by the second windows to create the pores.

In accordance with an even further aspect of the present invention, there is provided a memory cell. The memory cell includes an access device that is formed on a semiconductor substrate. A layer of dielectric material is disposed on the access device. The layer of dielectric material has a pore therein. The pore is formed by forming a mask over the layer of dielectric material. The mask has a window therein which exposes a portion of the layer of dielectric material. The window is sized at the photolithographic limit. A spacer is formed within the window. The spacer covers a peripheral portion of the exposed portion of the layer of dielectric material to create a second window exposing a portion of the layer of dielectric material smaller than the photolithographic limit. The exposed portion of the layer of dielectric material created by the second window is removed to create the pore. A first layer of conductive material is disposed within the pore to form a first electrode. A layer of structure changing material is disposed on the first electrode. A second layer of conductive material is disposed on the layer of structure changing material to form a second electrode.

DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
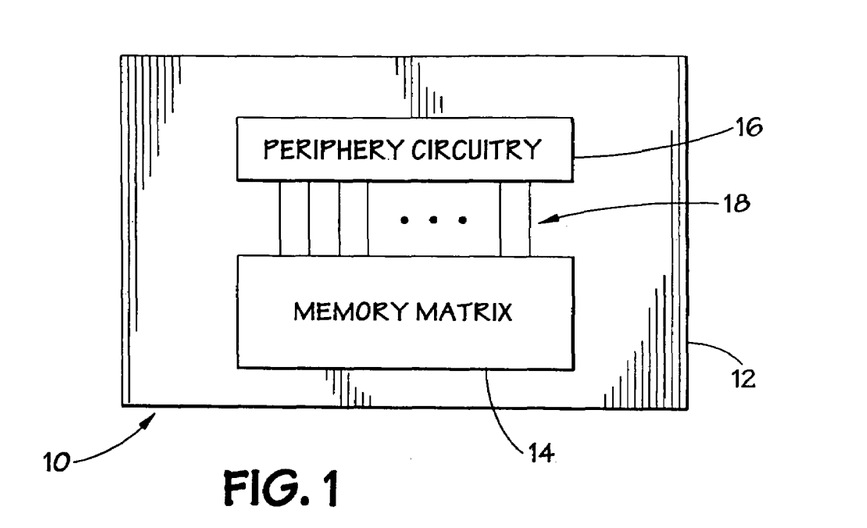
FIG. 1 illustrates a schematic depiction of a substrate containing a memory device which includes a memory matrix and peripheral circuitry.

Turning now to the drawings, and referring initially to FIG. 1, a memory device is illustrated and generally designated by a reference numeral 10. The memory device 10 is an integrated circuit memory that is advantageously formed on a semiconductor substrate 12. The memory device 10 includes a memory matrix or array 14 that includes a plurality of memory cells for storing data, as described below. The memory matrix 14 is coupled to periphery circuitry 16 by the plurality of control lines 18. The periphery circuitry 16 may include circuitry for addressing the memory cells contained within the memory matrix 14, along with circuitry for storing data in and retrieving data from the memory cells. The periphery circuitry 16 may also include other circuitry used for controlling or otherwise insuring the proper functioning of the memory device 10.

Figure 2:
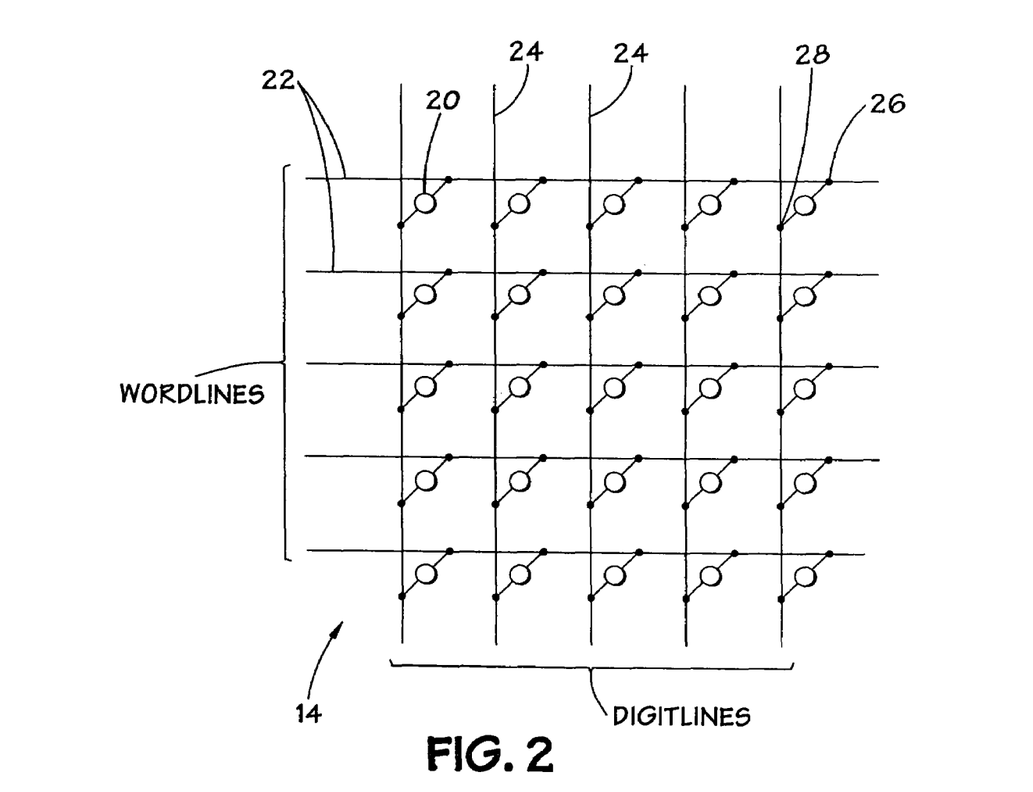
FIG. 2 illustrates an exemplary schematic depiction of the memory matrix or array of FIG. 1.

A more detailed depiction of the memory matrix 14 is illustrated in FIG. 2. As can be seen, the memory matrix 14 includes a plurality of memory cells 20 that are arranged in generally perpendicular rows and columns. The memory cells 20 in each row are coupled together by a respective word line 22, and the memory cells 20 in each column are coupled together by a respective digit line 24. Specifically, each memory cell 20 includes a word line node 26 that is coupled to a respective word line 22, and each memory cell 20 includes a digit line node 28 that is coupled to a respective digit line 24. The conductive word lines 22 and digit lines 24 are collectively referred to as address lines. These address lines are electrically coupled to the periphery circuitry 16 so that each of the memory cells 20 can be accessed for the storage and retrieval of information.

Figure 3:
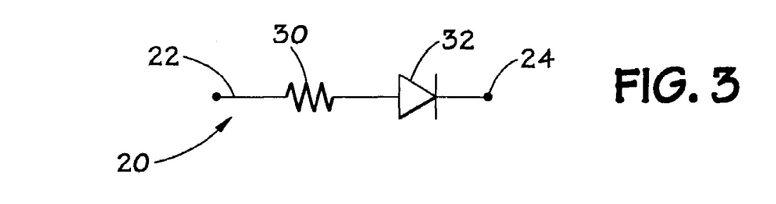
FIG. 3 illustrates an exemplary memory cell having a memory element, such as a resistor, and an access device, such as a diode.

FIG. 3 illustrates an exemplary memory cell 20 that may be used in the memory matrix 14. The memory cell 20 includes a memory element 30 which is coupled to an access device 32. In this embodiment, the memory element 30 is illustrated as a programmable resistive element, and the access device 32 is illustrated as a diode. Advantageously, the programmable resistive element may be made of a chalcogenide material, as will be more fully explained below. Also, the diode 32 may be a conventional diode, a zener diode, or an avalanche diode, depending upon whether the diode array of the memory matrix 14 is operated in a forward biased mode or a reverse biased mode. As illustrated in FIG. 3, the memory element 30 is coupled to a word line 22, and the access device 32 is coupled to a digit line 24. However, it should be understood that connections of the memory element 20 may be reversed without adversely affecting the operation of the memory matrix 14.

As mentioned previously, a chalcogenide resistor may be used as the memory element 30. A chalcogenide resistor is a structure changing memory element because its molecular order may be changed between an amorphous state and a crystalline state by the application of electrical current. In other words, a chalcogenide resistor is made of a state changeable material that can be switched from one detectable state to another detectable state or states. In state changeable materials, the detectable states may differ in their morphology, surface typography, relative degree of order, relative degree of disorder, electrical properties, optical properties, or combinations of one or more of these properties. The state of a state changeable material may be detected by measuring the electrical conductivity, electrical resistivity, optical transmissivity, optical absorption, optical refraction, optical reflectivity, or a combination of these properties. In the case of a chalcogenide resistor specifically, it may be switched between different structural states of local order across the entire spectrum between the completely amorphous state and the completely crystalline state.

The previously mentioned Ovshinsky patent contains a graphical representation of the resistance of an exemplary chalcogenide resistor as a function of voltage applied across the resistor. It is not unusual for a chalcogenide resistor to demonstrate a wide dynamic range of attainable resistance values of about two orders of magnitude. When the chalcogenide resistor is in its amorphous state, its resistance is relatively high. As the chalcogenide resistor changes to its crystalline state, its resistance decreases.

As discussed in the Ovshinsky patent, low voltages do not alter the structure of a chalcogenide resistor, while higher voltages may alter its structure. Thus, to "program" a chalcogenide resistor, i.e., to place the chalcogenide resistor in a selected physical or resistive state, a selected voltage in the range of higher voltages is applied across the chalcogenide resistor, i.e., between the word line 22 and the digit line 24. Once the state of the chalcogenide resistor has been set by the appropriate programming voltage, the state does not change until another programming voltage is applied to the chalcogenide resistor. Therefore, once the chalcogenide resistor has been programmed, a low voltage may be applied to the chalcogenide resistor, i.e., between the word line 22 and the digit line 24, to determine its resistance without changing its physical state. As mentioned previously, the addressing, programming, and reading of the memory elements 20 and, thus, the application of particular voltages across the word lines 22 and digit lines 24, is facilitated by the periphery circuitry 16.

Figure 4:
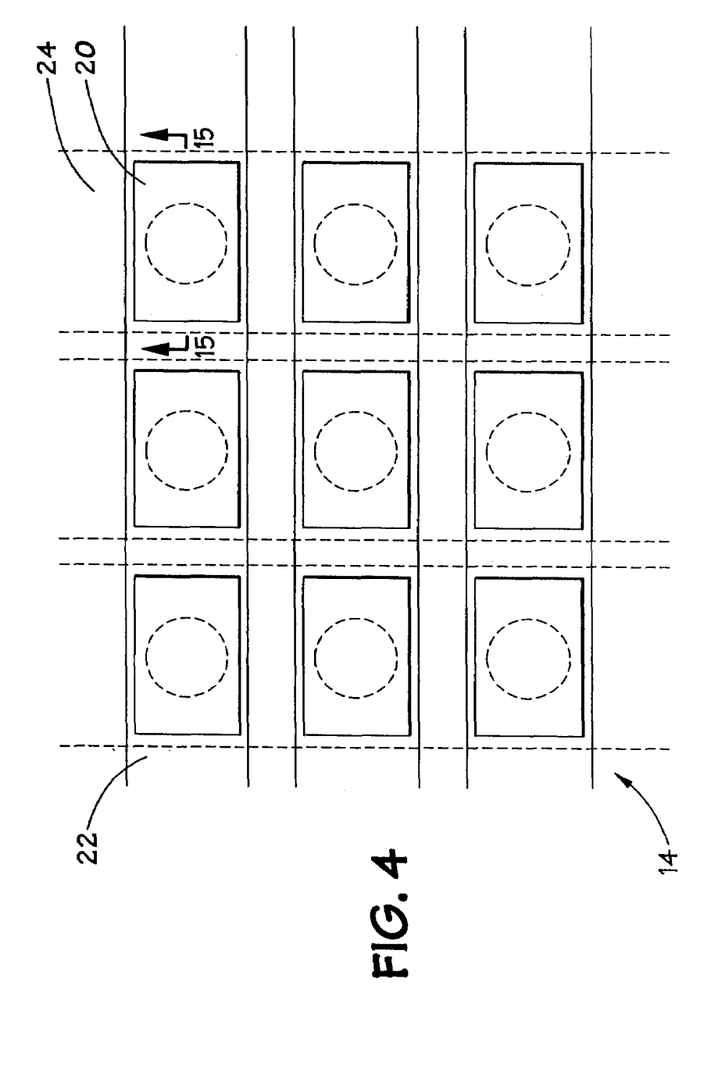
FIG. 4 illustrates a top view of a portion of a semiconductor memory array.

The memory cell 20, as illustrated in FIG. 3, may offer significant packaging advantages as compared with memory cells used in traditional random access and read only memories. This advantage stems from the fact that the memory cell 20 is a vertically integrated device. In other words, the memory element 30 may be fabricated on top of the access device 32. Therefore, using the memory cell 20, it may be possible to fabricate an X-point cell that is the same size as the crossing area of the word line 22 and the digit line 24, as illustrated in FIG. 4. However, the size of the access device 32 typically limits the area of the memory cell 20, because the access device 32 must be large enough to handle the programming current needed by the memory element 30.

As discussed previously, to reduce the required programming current, many efforts have been made to reduce the pore size of the chalcogenide material that forms the memory element 30. These efforts have been made in view of the theory that only a small portion of the chalcogenide material, referred to as the "active region," is structurally altered by the programming current. However, it is believed that the size of the active area of the chalcogenide memory element 30 may be reduced by reducing the size of an electrode which borders the chalcogenide material. By reducing the active area and, thus, the required programming current, the size of the access device may be reduced to create an X-point cell memory. For example, a cell with a chalcogenide cross-sectional area equivalent to a circle with a 0.2 μm diameter might require a current pulse of 2 mA to program to high resistance state. If the diameter of the cell is reduced to 0.1 μm the current could be reduced to about 0.5 mA. Over certain ranges of operation the programming current is directly proportional to the area of the cell.

Figure 14:
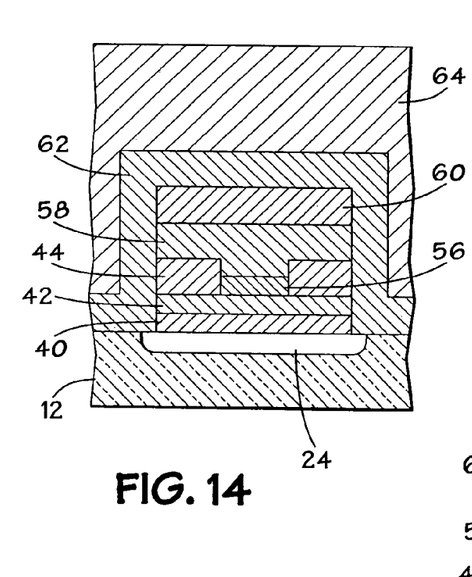
FIG. 14 illustrates the deposition of an insulative layer and an oxide layer over the upper electrode of the memory cell.
Figure 15:
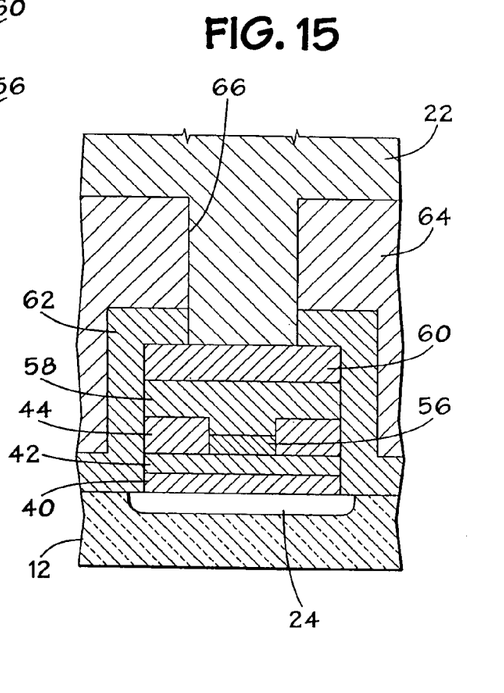
FIG. 15 illustrates the formation of a contact extending through the oxide and insulative layer to contact the upper electrode.

The actual structure of an exemplary memory cell 20 is illustrated in FIG. 15, while a method for fabricating the memory cell 20 is described with reference to FIGS. 5-15. It should be understood that while the fabrication of only a single memory cell 20 is discussed below, thousands of similar memory cells may be fabricated simultaneously. Although not illustrated, each memory cell is electrically isolated from other memory cells in the array in any suitable manner, such as by the addition imbedded field oxide regions between each memory cell.

Figure 5:
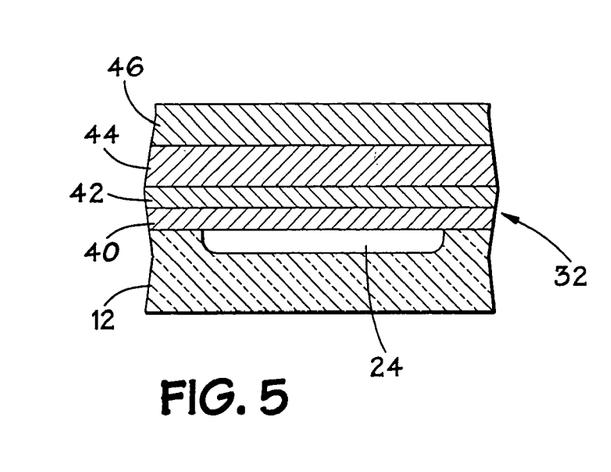
FIG. 5 illustrates a cross-sectional view of an exemplary memory cell at an early stage of fabrication.

In the interest of clarity, the reference numerals designating the more general structures described in reference to FIGS. 1-4 will be used to describe the more detailed structures illustrated in FIGS. 5-15, where appropriate. Referring first to FIG. 5, the digit lines 24 are formed in or on a substrate 12. As illustrated in FIG. 5, the digit line 24 is formed in the P-type substrate 12 as a heavily doped N+ type trench. This trench may be strapped with appropriate materials to enhance its conductivity. The access device 32 is formed on top of the digit line 24. The illustrated access device 32 is a diode formed by a layer of N doped polysilicon 40 and a layer of P+ doped polysilicon 42. Next, a layer of insulative or dielectric material 44 is disposed on top of the P+ layer 42. The layer 44 may be formed from any suitable insulative or dielectric material, such as plasma enhanced CVD $SiO_2$, or PECVD silicon nitride or standard thermal CVD $Sa_3Ny$.

Figure 6:
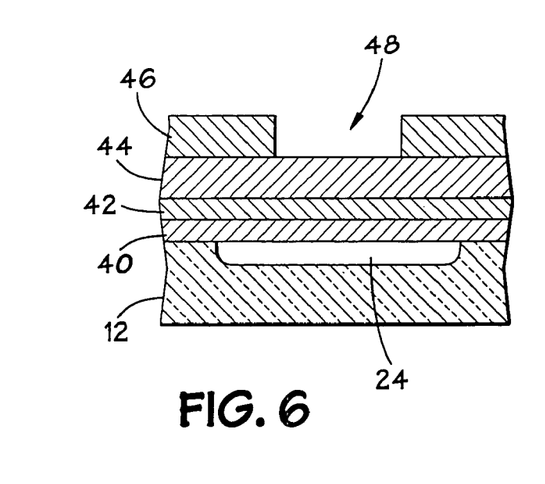
FIG. 6, FIG. 7, and FIG. 8 illustrate the formation of a spacer and a small pore for the exemplary memory element.

The formation of a small pore in the dielectric layer 44 is illustrated with reference to FIGS. 5-9. First, a hard mask 46 is deposited on top of the dielectric layer 44 and patterned to form a window 48, as illustrated in FIG. 6. The window 48 in the hard mask 46 is advantageously as small as possible. For instance, the window 48 may be formed at the photolithographic limit by conventional photolithographic techniques. The photolithographic limit, i.e., the smallest feature that can be patterned using photolithographic techniques, is currently about 0.2 μm. Once the window 48 has been formed in the hard mask 46, a layer of spacer material 50 is deposited over the hard mask 46 in a conformal fashion so that the upper surface of the spacer material 50 is recessed where the spacer material 50 covers the window 48. Although any suitable material may be used for the spacer material 50, a dielectric material, such CVD amorphous or polycrystalline silicon, may be advantageous.

Figure 7:
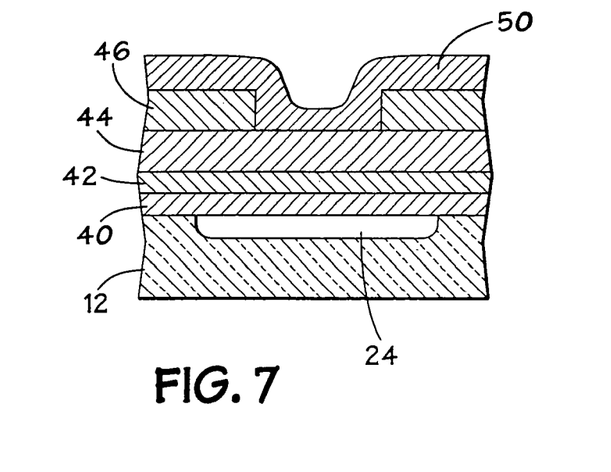

The layer of spacer material 50 is subjected to an anisotropic etch using a suitable etchant, such as $HBr+Cl_2$. The rate and time of the etch are controlled so that the layer of spacer material 50 is substantially removed from the upper surface of the hard mask 48 and from a portion of the upper surface of the dielectric layer 44 within the window 48, leaving sidewall spacers 52 within the window 48. The sidewall spacers 52 remain after a properly controlled etch because the vertical dimension of the spacer material 50 near the sidewalls of the window 48 is approximately twice as great as the vertical dimension of the spacer material 50 on the surface of the hard mask 46 and in the recessed area of the window 48.

Figure 8:
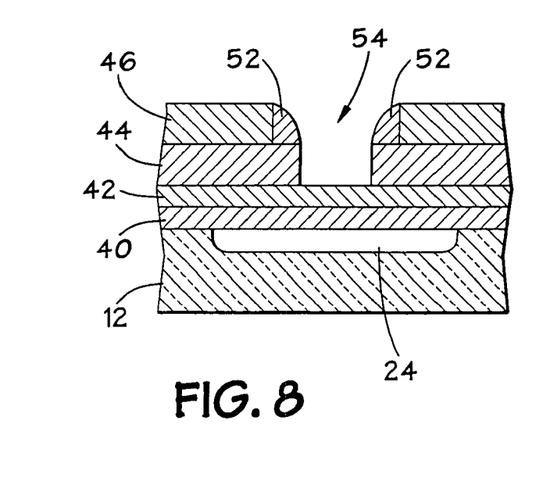
Figure 9:
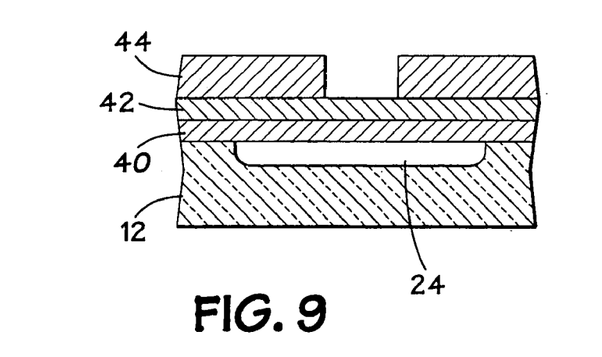
FIG. 9 illustrates the small pore of the memory element.

Once the spacers 52 have been formed, an etchant is applied to the structure to form a pore 54 in the dielectric layer 44, as illustrated in FIG. 8. The etchant is an anisotropic etchant that selectively removes the material of the dielectric layer 44 bounded by the spacers 52 until the P+ layer 42 is reached. As a result of the fabrication method to this point, if the window 48 is at the photolithographic limit, the pore 54 is smaller than the photolithigraphic limit, e.g., on the order of 0.1 μm. After the pore 54 has been formed, the hard mask 46 and the spacers 52 may be removed, as illustrated in FIG. 9. The hard mask 46 and the spacers 52 may be removed by any suitable method, such as by etching or by chemical mechanical planarization (CMP).

Figure 10:
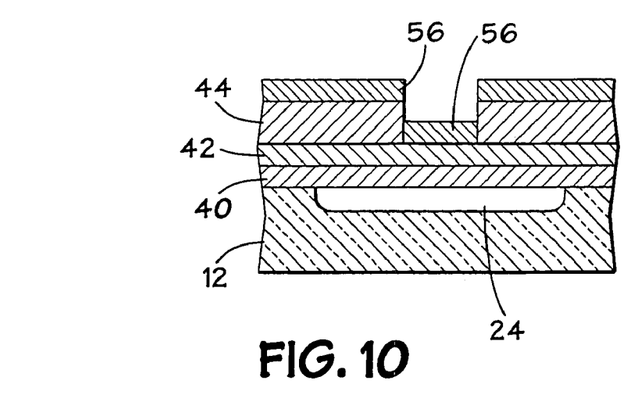
FIG. 10 and FIG. 11 illustrate the formation of an electrode in the small pore.
Figure 11:
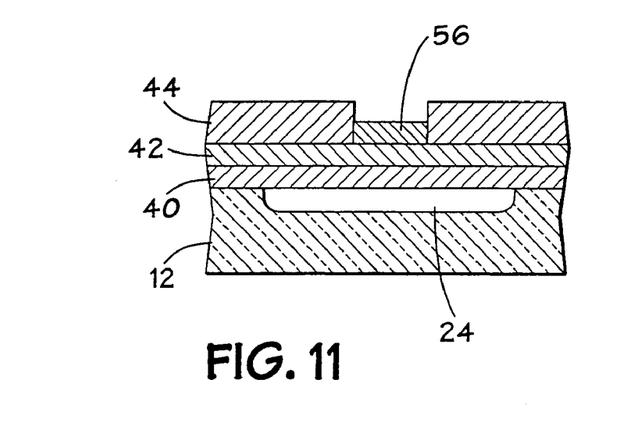

The pore 54 is then filled to a desired level with a material suitable to form the lower electrode of the chalcogenide memory element 30. As illustrated in FIG. 10, a layer of electrode material 56 is deposited using collimated physical vapor deposition (PVD). By using collimated PVD, or another suitable directional deposition technique, the layer of electrode material 56 is formed on top of the dielectric layer 44 and within the pore 54 with substantially no sidewalls. Thus, the layer of electrode material 56 on top of the dielectric layer 44 may be removed, using CMP for instance, to leave the electrode 56 at the bottom of the pore 54, as illustrated in FIG. 11. It should be understood that the electrode material 56 may be comprised of one or more materials, and it may be formed in one or more layers. For instance, a lower layer of carbon may be used as a barrier layer to prevent unwanted migration between the subsequently deposited chalcogenide material and the P+ type layer 42. A layer of titanium nitride (TiN) may then be deposited upon the layer of carbon to complete the formation of the electrode 56.

Figure 12:
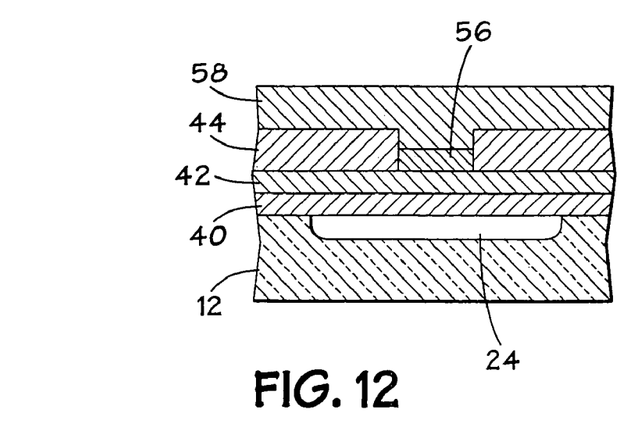
FIG. 12 illustrates the deposition of memory material over the lower electrode.

After the lower electrode 56 has been formed, a layer of chalcogenide material 58 may be deposited so that it contacts the lower electrode 56, as illustrated in FIG. 12. Various types of chalcogenide materials may be used to form the chalcogenide memory element 30. For example, chalcogenide alloys may be formed from tellurium, antimony, germanium, selenium, bismuth, lead, strontium, arsenic, sulfur, silicon, phosphorous, and oxygen. Advantageously, the particular alloy selected should be capable of assuming at least two generally stable states in response to a stimulus, for a binary memory, and capable of assuming multiple generally stable states in response to a stimulus, for a higher order memory. Generally speaking, the stimulus will be an electrical signal, and the multiple states will be different states of crystallinity having varying levels of electrical resistance. Alloys that may be particularly advantageous include tellurium, antimony, and germanium having approximately 55 to 85 percent tellurium and 15 to 25 percent germanium, such as $Te_{56}Ge_{22}Sb_{22}$.

If the lower electrode 56 is recessed within the pore 54, a portion of the chalcogenide material 58 will fill the remaining portion of the pore 54. In this case, any chalcogenide material 58 adjacent the pore 54 on the surface of the dielectric layer 44 may be removed, using CMP for instance, to create a chalcogenide element of extremely small proportions. Alternatively, if the lower electrode 56 completely fills the pore 54, the chalcogenide material 58 adjacent the pore 54 may remain, because the extremely small size of the lower electrode 56 still creates a relatively small active area in a vertical direction through the chalcogenide material 58. Because of this characteristic, even if the lower electrode 56 only partially fills the pore 54, as illustrated, the excess chalcogenide material 58 adjacent the pore 54 need not be removed to create a memory element 30 having an extremely small active area.

Figure 13:
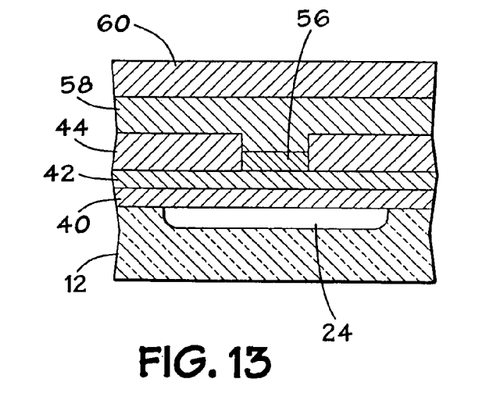
FIG. 13 illustrates the deposition of the upper electrode of the memory cell.

Regardless of which alternative is chosen, the upper electrode 60 is deposited on top of the chalcogenide material 58, as illustrated in FIG. 13. After the upper electrode 60, the chalcogenide material 58, the dielectric layer 44, and the access device 32 have been patterned and etched to form an individual memory cell 20, a layer of insulative material 62, such as silicon nitride, is deposited over the structure, as illustrated in FIG. 14. A layer of oxide 64 is then deposited over the insulative layer 62. Finally, the oxide layer 64 is patterned and a contact hole 66 is formed through the oxide layer 64 and the insulative layer 62, as illustrated in FIG. 15. The contact hole 66 is filled with a conductive material to form the word line 22.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory cell comprising:
 a memory element comprising a memory material disposed between a first electrode and a second electrode, the first electrode being disposed within a pore formed in a dielectric material, wherein the memory material is disposed over the pore in contact with the dielectric material in which the pore is formed; and
 an access device being coupled to the first electrode and being self-aligned with the memory element.

2. The memory cell, as set forth in claim 1, wherein the access device comprises a diode.

3. The memory cell, as set forth in claim 2, wherein the diode comprises N doped polysilicon disposed adjacent P doped polysilicon.

4. The memory cell, as set forth in claim 1, wherein the memory material comprises structure changing material.

5. The memory cell, as set forth in claim 4, wherein the structure changing material comprises a material which changes between different states of crystallinity in response to electrical stimulus.

6. The memory cell, as set forth in claim 5, wherein each of the different states of crystallinity corresponds to a given resistance level.

7. The memory cell, as set forth in claim 1, wherein the memory material comprises a chalcogenide material.

8. The memory cell, as set forth in claim 1, wherein the memory material comprises a programmable resistive element.

9. The memory cell, as set forth in claim 8, wherein the programmable resistive element changes between different resistance levels in response to electrical stimulus.

10. The memory cell, as set forth in claim 1, wherein the memory material comprises solid, amorphous chalcogenide containing selenium.

11. The memory cell, as set forth in claim 1, wherein the access device controls electrical current through the memory element.

12. The memory cell, as set forth in claim 1, wherein the access device is disposed in line with the memory element.

13. The memory cell, as set forth in claim 1, wherein the access device and the memory element have substantially the same cross-sectional area.

14. The memory cell, as set forth in claim 1, wherein the memory element and the access device comprise substantially the same lateral areas and wherein the memory element is disposed directly over the access device.

15. A memory cell comprising:
   an access device; and
   a memory element operatively coupled to the access device, the memory element comprising:
      a first electrode disposed within a pore formed in a dielectric material;
      a memory material disposed over the first electrode, wherein a junction area between the first electrode and the memory material is defined by dimensions of the pore and is smaller than a lateral cross-sectional area of the memory material; and
      a second electrode disposed over the memory material.

16. The memory cell, as set forth in claim 15, wherein the pore is smaller than the photolithographic limit.

17. The memory cell, as set forth in claim 15, wherein the memory material comprises structure changing material.

18. The memory cell, as set forth in claim 15, wherein the memory material is disposed within the pore.

19. The memory cell, as set forth in claim 18, wherein the second electrode is disposed over the pore.

* * * * *